United States Patent [19]
Wojnarowski et al.

[11] Patent Number: 5,872,040
[45] Date of Patent: Feb. 16, 1999

[54] METHOD FOR FABRICATING A THIN FILM CAPACITOR

[75] Inventors: Robert John Wojnarowski, Ballston Lake; James Wilson Rose, Guilderland; Ernest Wayne Balch, Ballston Spa; Leonard Richard Douglas, Burnt Hills; Evan Taylor Downey, Niskayuna; Michael Gdula, Knox, all of N.Y.

[73] Assignee: General Electric Company, Schenectady, N.Y.

[21] Appl. No.: 862,994

[22] Filed: May 27, 1997

Related U.S. Application Data

[62] Division of Ser. No. 349,278, Dec. 5, 1994, Pat. No. 5,683,928.

[51] Int. Cl.⁶ .................................................. H01L 21/20
[52] U.S. Cl. ............................................ 438/393; 438/394
[58] Field of Search ................................. 438/393, 394, 438/395, 396, 397, 398, 399; 361/291, 313

[56] References Cited

U.S. PATENT DOCUMENTS

| | | |
|---|---|---|
| 3,781,610 | 12/1973 | Bodway . |
| 3,947,934 | 4/1976 | Olson ..................................... 29/25.42 |
| 4,020,222 | 4/1977 | Kausche et al. . |
| 4,087,778 | 5/1978 | Merz et al. . |
| 4,200,970 | 5/1980 | Schanberger ........................... 29/593 |
| 4,388,506 | 6/1983 | Geller et al. ........................... 361/291 |
| 4,418,474 | 12/1983 | Barnett . |
| 4,470,096 | 9/1984 | Guertin .................................. 361/277 |
| 4,570,201 | 2/1986 | Bentley .................................. 361/323 |
| 4,783,695 | 11/1988 | Eichelberger et al. . |
| 4,801,469 | 1/1989 | Norwood . |
| 5,043,295 | 8/1991 | Ruggerio et al. ...................... 437/918 |
| 5,084,420 | 1/1992 | Tsai ....................................... 437/918 |
| 5,266,529 | 11/1993 | Lou et al. .............................. 437/918 |
| 5,323,138 | 6/1994 | Oki et al. . |
| 5,345,361 | 9/1994 | Billotte et al. ......................... 361/313 |
| 5,347,423 | 9/1994 | DeNeuf et al. ......................... 3/3 |
| 5,353,498 | 10/1994 | Fillion et al. . |
| 5,358,775 | 10/1994 | Horn, III ............................... 428/209 |

(List continued on next page.)

OTHER PUBLICATIONS

U.S. Patent application No. 08/349,228 "Thin Film Resistors on Organic Surfaces" by Robert J. Wojnarowski, et al, filed Dec. 5, 1994.

"Response Surface Methodology", by William G. Hunter, Quality Control Handbook, Section 28, pp. 28–1–28–12.

"Lightly Trimming the Hybrids" by Elshabini–Riad, et al, 1993 IEEE, Circuits and Devices, pp. 30–34.

"Electrical Trimming of Ion–Beam–Sputtered Polysilicon Resistors by High Current Pulses" by Soumen Das, et al, IEEE Transactions on Electron Devices, vol. 41, No. 8, Aug. 1994, pp. 1429–1434.

"Improvement of Laser Trimmed Laser Resistor Stability by Selection of Optimal Trim Paths" by Jaime Ramfrez–Angulo, et al, IEEE pp. 2188–2191, Apr. 1991.

"A Technology for High Density Mounting Utilitzing Polymeric Multilayer Substrate" by M. Takeuchi, et al, IEEE/CHMT 1989 Japan IEMT Symposium, pp. 136–140.

*Primary Examiner*—Charles Bowers
*Assistant Examiner*—Craig Thompson
*Attorney, Agent, or Firm*—Ann M. Agosti; Marvin Snyder

[57] ABSTRACT

A method is provided for the manufacture of precision electronic components such as resistors, inductors, and capacitors on a polymer or ceramic surface. The electronic components can be deposited and trimmed to precise or matched values without having precise depositions of all of the pre-patterned materials. Thin film electronic components are deposited on a surface, parameter values are measured or estimated, a correction offset file is generated, and the components are trimmed using adaptive lithography to a very close tolerance. A computer program can be used to enable the adjustment of electronic components by techniques such as changing the physical length of an inductor coil or resistor lead, or by changing a capacitor plate area.

4 Claims, 8 Drawing Sheets

U.S. PATENT DOCUMENTS

| | | |
|---|---|---|
| 5,370,776 | 12/1994 | Desaigoudar et al. . |
| 5,420,063 | 5/1995 | Maghroudnia et al. ................. 437/918 |
| 5,420,515 | 5/1995 | Uhling et al. ........................... 324/601 |
| 5,450,263 | 9/1995 | Desaigoudar et al. . |
| 5,468,672 | 11/1995 | Rosvold ................................... 437/918 |
| 5,469,131 | 11/1995 | Takahashi et al. . |
| 5,496,762 | 3/1996 | Sandhu et al. ................. 148/DIG. 136 |
| 5,547,896 | 8/1996 | Linn et al. .............................. 437/918 |

METHOD FOR FABRICATING A THIN FILM CAPACITOR

This application is a division of application Ser. No. 08/349,278, filed Dec. 5, 1994, now U.S. Pat. No. 5,683,928.

This invention was made with Government support under Government Contract No. 93F146400-000. The Government has certain rights in this invention.

CROSS-REFERENCE TO RELATED APPLICATION

This application is related to the following co-pending application which is commonly assigned and is incorporated herein by reference: R. J. Wojnarowski et al., "Thin Film Resistors on Organic Surfaces," U.S. application Ser. No. 08/349,228 (attorney docket number RD-23,519), filed concurrently herewith.

BACKGROUND OF THE INVENTION

1. Field of the Invention

This invention relates generally to thin film electronic components and, more particularly, to thin film electronic components having precise parameters.

2. Description of the Related Art

Multi-chip modules (MCMs) require micro-miniature electronic components to achieve their greatest potential for performance and reduced size. For example, many MCMs require terminating resistors that can be placed in close proximity to the actual point of the electrical run termination, and micro-analog, high speed digital, and microwave circuits often need resistors to trim their gains, terminate their runs, and bias their thresholds. Conventional electronic components are frequently chips which are too large, occupy too much substrate space, and limit routing options.

Thin film deposition of resistors using conventional techniques on ceramic surfaces has been difficult, and resistors have not been deposited on polymer surfaces. Thin film resistor fabrication is complicated because each resistor deposition is slightly different, and the sheet resistance is not uniform throughout an underlying surface. Variabilities of 4%–10% are common because of variables in the resistor sputtering conditions. Therefore, for precision resistors, each resistor must be measured and, if not within tolerance, requires customized artwork based upon the characteristics of the deposition. Subsequent trim operations on ceramic surfaces can be used, but these operations require special equipment and are expensive. Plasma etching (such as $CF_4$ or $CF_4+O_2$), chemical or heat oxidation, or chemical anodizing can also be used to increase resistor values, but are not efficient for changing a plurality of resistors because a photoresist and etch step would be required for each individual resistor and result in increased processing time and expense.

It would be desirable to have a method of mass trimming of thin film electronic devices which enables highly accurate and close tolerance multi-chip module component fabrication.

SUMMARY OF THE INVENTION

Accordingly, it is an object of the invention to provide precise electronic components even when thin film deposition can be imprecise.

This invention provides a method for the manufacture of precision electronic components such as resistors, inductors, and capacitors, for example, on a polymer or ceramic surface. The electronic components can be deposited and trimmed to precise or matched values without having precise depositions of all of the pre-patterned materials. Thin film electronic components are deposited on a surface, parameter values are measured or estimated, a correction offset file is generated, and the components are trimmed using adaptive lithography to a very close tolerance. A computer program can be used to enable the adjustment of electronic components by changing the physical length of an inductor coil or resistor lead, or by changing the capacitor plate area, for example.

Briefly, in accordance with a preferred embodiment of the invention, a method for fabricating a thin film resistor comprises applying resistor material over a dielectric layer, applying a metallization layer over the resistor material, and patterning the metallization layer with a first portion of the metallization layer situated apart from a second portion of the metallization layer and both the first and second portions being at least partially situated over the resistor material. Then the resistance value between the first and second portions is estimated. An estimation is made of the distance between the first and second portions useful for obtaining a modified resistance value between the first and second portions that is closer to a predetermined resistance value than the estimated resistance value. At least one of the first and second portions is trimmed to create an actual distance between the first and second portions equivalent to the estimated distance.

In accordance with another preferred embodiment of the invention, a method for fabricating a thin film resistor comprises applying resistor material over a base layer, characterizing the sheet resistance of the resistor material, and estimating a distance along a resistor portion of the resistor material required to obtain a predetermined resistance value. A metallization layer is applied over the resistor material and patterned with a first portion of the metallization layer situated apart from a second portion of the metallization layer. The first and second portions are at least partially situated over the resistor material and are separated by the estimated distance.

In accordance with another preferred embodiment of the invention, a method for fabricating a capacitor comprises depositing a first metal plate over a base layer, applying an insulative layer over at least a portion of the first metal plate, and depositing a second metal plate over at least a portion of the insulative layer. The capacitance between the first and second metal plates is measured. An estimation is made of the surface area of the second metal plate useful for obtaining a modified capacitance value between the first and second metal plates that is closer to a predetermined capacitance value than the measured capacitance value. The second metal plate is trimmed to create an actual surface area equivalent to the estimated surface area.

In accordance with another preferred embodiment of the invention, a method for fabricating an inductor comprises depositing a metallization layer over a base layer, patterning the metallization layer to form a metal coil having an inductance value higher than a predetermined inductance value, measuring the inductance value of the metal coil, and estimating the length of metal coil useful for obtaining the desired inductance value. A dielectric layer is applied over the metal coil, and two vias are formed in the dielectric layer, each of the vias extending to a portion of the coil and being separated along the coil by the estimated length.

In accordance with another preferred embodiment of the invention, a method for fabricating a plurality of thin film resistors comprises applying resistor material over a dielectric layer, applying a metallization layer over the resistor material, and patterning the metallization layer to form the plurality of resistors. Each of the resistors includes a first respective portion of the metallization layer situated apart from a second respective portion of the metallization layer with both the first and second respective portions of the metallization layer being at least partially situated over the resistor material. A resistance value is estimated for each of the resistors. Estimations are made of respective distances for each of the resistors between the respective first and second portions useful for obtaining a modified resistance value between the first and second portions that is closer to a respective predetermined resistance value than the estimated resistance value. At least one of the respective first and second portions of each of the resistors is trimmed to create an actual distance between the first and second portions equivalent to the estimated distance.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

In this invention, measurements or estimations are made of patterned components and a computer program is used to generate an offset adaptive file that will bring all the parameters to desired values after further processing. Although the discussions of FIGS. 1–8 focus on resistors, this technique is applicable to any film electronic component including, without limitation, the capacitor and inductor shown in FIGS. 9–11 respectively.

Figure 1:
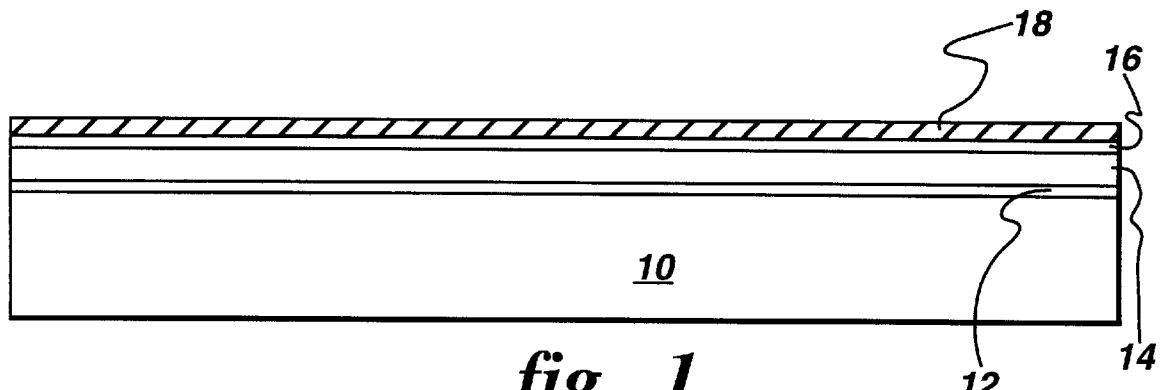
FIG. 1 is a sectional side view of resistor material and metallization of the present invention prior to patterning.

FIG. 1 is a sectional side view of resistor material 16 and metallization 18 of the present invention overlying a dielectric layer 14 which itself overlies a substrate 10. Substrate 10 may comprise any suitable structure material. In one embodiment, the substrate comprises a ceramic such as alumina. Dielectric layer 14 preferably comprises a polymer film having a low coefficient of thermal expansion (CTE) such as Kapton-E polyimide (13 ppm/°C. (parts per million per degree centigrade)—Kapton is a trademark of E. I. duPont de Nemours & Co.) or Upilex-S polyimide (12 ppm/°C.—Upilex is a trademark of UBE Industries, Ltd.). A low CTE is useful because many polymers have CTEs greater than 20 ppm/°C., whereas the preferred resistor material ($Ta_2N$) has a CTE which can be 10 ppm/°C. or less. When materials having a CTE much greater than the CTE of the resistor material are used, a stress is generated at the interface which can result in a crack of the film of resistor material.

Dielectric layer 14 is preferably laminated to substrate 10 using a substrate adhesive 12 comprising any appropriate adhesive material such as, for example, Ultem polyetherimide (Ultem is a registered trademark of General Electric Co.).

Resistor material 16 is applied over the dielectric layer. In the preferred embodiment, the resistor material comprises tantalum nitride. Tantalum nitride can be a BCC (body centered cubic structure) beta-tantalum, a FCC (face centered cubic structure) TaN, or a $Ta_2N$ HCP (hexagonal close packed structure). Preferably the tantalum nitride resistor material is of the $Ta_2N$ phase of the material in its most stable hexagonal closed packed form, although there can also be mixtures of these phases which can be used for higher resistance values, depending upon the sputtering deposition conditions. TaN FCC material, for example, has a high resistance value, but is more variable than $Ta_2N$ HCP material and has more drift. Tantalum nitride resistors are reactively deposited by a sputtering operation using mixed gases, such as nitrogen and argon at predetermined ratios, pressures, and plasma power settings. Tantalum nitride resistors are advantageous because they are more stable at high temperatures than the more commonly used nichrome (NiCr) resistors, and they are compatible with high density interconnect techniques such as those described in Eichelberger et al., U.S. Pat. No. 4,783,695, issued Nov. 8, 1988.

Prior to the deposition of resistor material, the surface of dielectric layer 14 should be free of scratches and holes which cause defective resistor sites. This can be facilitated by cleaning the substrate material and applying a plasma RIE (reactive ion etch) for adhesion promotion.

The substrate is preferably placed on a heat sink block and mechanically held with screws to limit the heat that is built up during the sputtering operations. The pressure is then reduced in a vacuum chamber to less than $1 \times 10^{-6}$ torr for a length of time sufficient to eliminate outgassing and moisture. The dielectric layer is backsputtered with argon at 400 watts of RF (radio frequency) energy for approximately one minute. The DC (direct current) magnetron sputterer containing the tantalum sputtering target pre-sputters the sputtering area for one minute for cleaning and conditioning. Then the substrate is positioned under the sputtering target, and a layer of 1500 to 3000 Å of tantalum nitride is reactively applied by DC (direct current) sputtering using a predetermined mixture of $N_2$ and Ar gasses.

If desired, after the resistor material is applied, the resistor material can be patterned with a tantalum etch, for example, to limit the presence of the resistor material to the vicinity of the fabrication location of the thin film resistor.

A metallization layer 18 is applied over the resistor material. The metallization layer may comprise any electrically conductive material that can withstand the fabrication processes and the applications of the specific MCM. In one embodiment, immediately after the sputtering of the resistor material, a 1000 Å layer of titanium is sputtered, followed by a 3000 Å layer of copper. Then the substrate is removed from the vacuum chamber deposition system and is placed on an electroplating cathode. Immersion in an acid copper sulfate electroplating bath without current for about 15 seconds can be used as a preclean and adhesion step. The copper is then electroplated to 4 microns thickness. The metallization layer is rinsed, dried, and positioned back in the sputtering system for the application of 1000 Å of titanium.

After deposition, the resistance of the resistor material increases a small percentage (approximately seven percent) initially and then becomes stable. The resistors can be stabilized by being heated in a vacuum or inert gas oven at temperatures of approximately 200° C. to 250° C. for 10–30 minutes to limit a tantalum oxide formation at the surface. The stabilization is done so as not to oxidize the copper layer. IR (infrared) heating can also be provided using an $N_2$ gas purge, for example.

Figure 2:
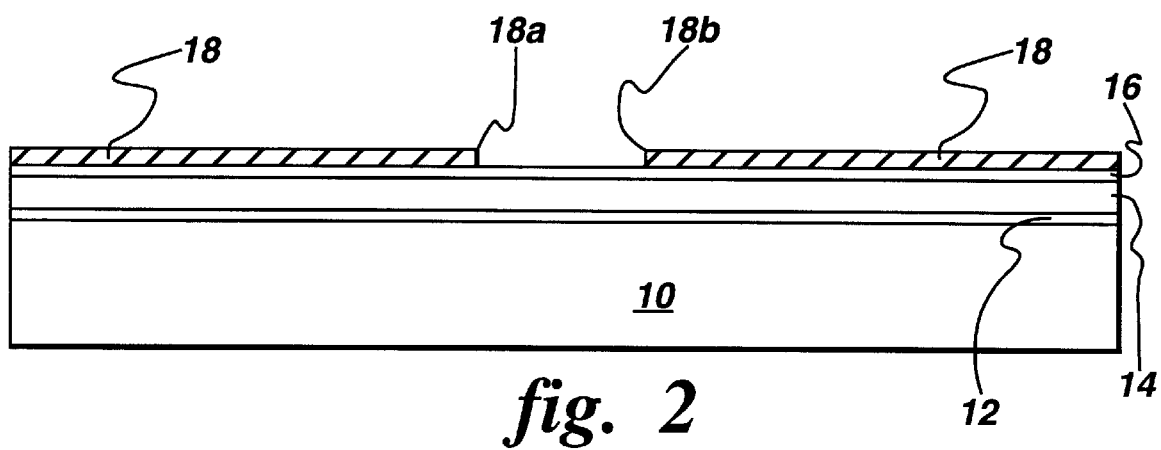
FIG. 2 is a view similar to that of FIG. 1 after metallization patterning has occurred.

FIG. 2 is a view similar to that of FIG. 1 after metallization patterning has occurred. A first portion 18a of the metallization layer is situated apart from a second portion 18b of the metallization layer with both the first and second portions being at least partially situated on the tantalum nitride layer. Metallization layer 18 can be patterned, for example, by removing the substrate from the vacuum chamber, applying a positive photoresist, and drying the photoresist on a hotplate. The metallization can be subjected to laser lithography, or equivalent photoresist exposure techniques, to expose a desired pattern. The metallization layer is then etched using conventional processes. If the metallization layer includes a plurality of individual metals, each of the metals can be etched separately. For example, the top titanium layer can be etched using a conventional titanium etch, a ferric chloride copper etch can be used to pattern the copper, and a second titanium removal step can be used to remove the lower titanium layer. Furthermore, if desired, a separate etch step can performed to pattern the resistor material. For simplicity of illustration, a single resistor is shown in FIG. 2; however, the metallization layer is often patterned to create a plurality of resistors.

Figure 3:
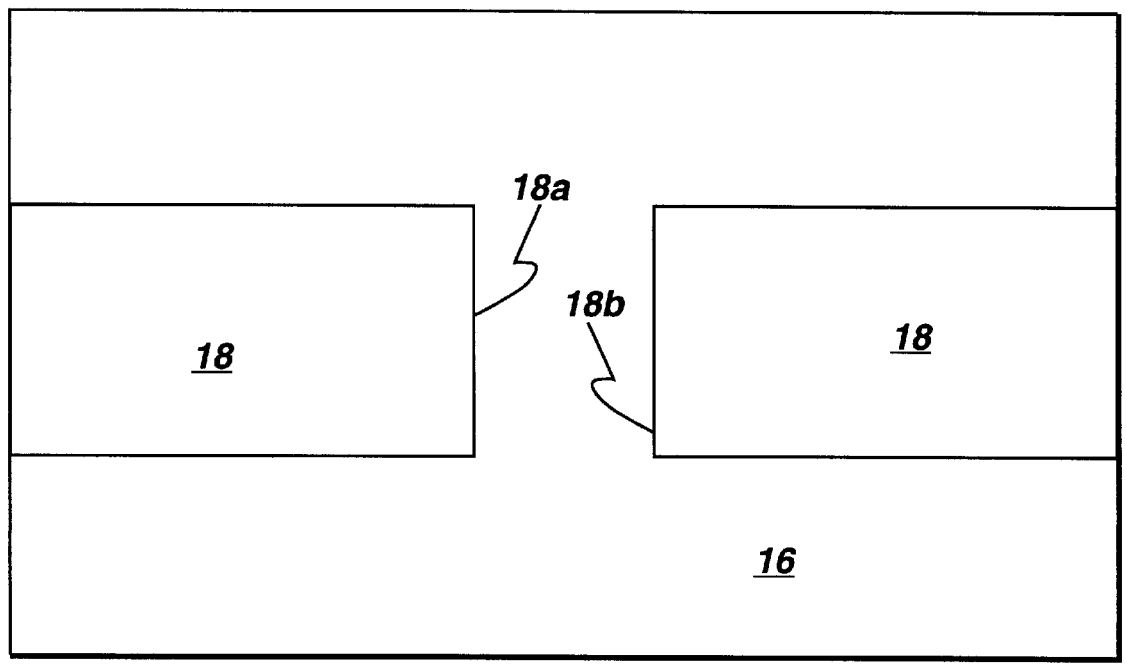
FIG. 3 is a top view of the resistor material and metallization shown in FIG. 2.

FIG. 3 is a top view of the resistor material and metallization shown in FIG. 2. The metallization layer is patterned so as to leave less space (and thus less resistance) between the first and second portions of the metallization layer than will be appropriate for the final resistor. This initial patterning technique allows the resistance to be measured or otherwise estimated, and the metallization layer to be further trimmed accordingly.

Figure 4:
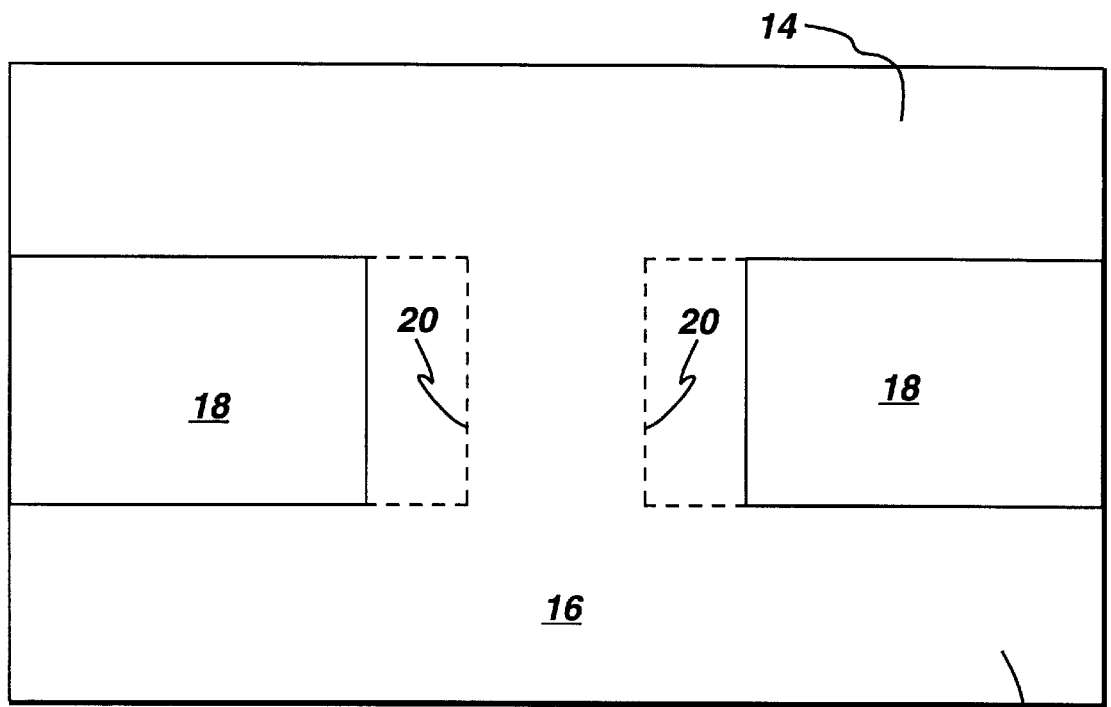
FIG. 4 is a view similar to that of FIG. 3 showing the metallization after trimming.

FIG. 4 is a view similar to that of FIG. 3 showing the metallization and resistor material after trimming, with dashed lines 20 representing the original locations of the metallization layer. The trimming can be performed in the same manner as discussed with respect to the metallization patterning in FIG. 2.

Any one of a number of different methods can be used to estimate the resistance of the resistor. For example, a probe (not shown) can probe metallization layer 18 directly to measure the resistance.

Figure 5:
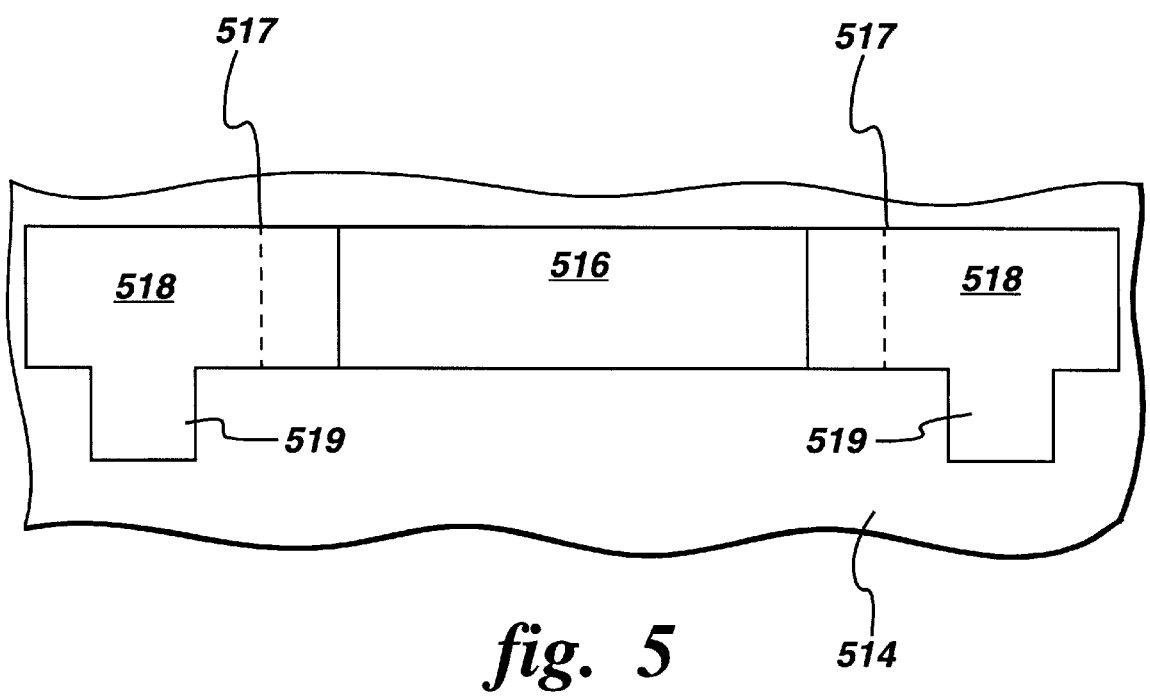
FIG. 5 is a top view showing removable tabs for probing the metallization.
Figure 6:
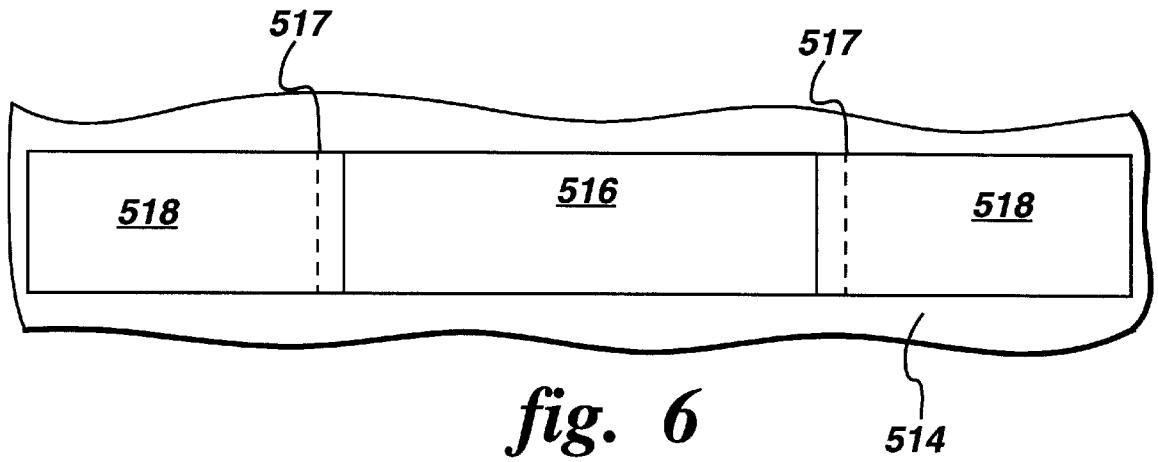
FIG. 6 is a view similar to that of FIG. 5, showing the metallization layer after trimming.

In another embodiment, as shown in the top view of FIG. 5, removable tabs 519 are patterned simultaneously with metallization layer 518. These tabs are useful for measuring the resistance value without damaging the resistor metallization, and resistors may be stabilized by the use of these tabs by applying electrical power to the resistor material through the tabs to raise the temperature instead of using an external source of heat. After the resistance is measured, the tabs can be etched or otherwise removed at the same time the metallization layer is trimmed, resulting in the embodiment shown in FIG. 6. FIGS. 5 and 6 also illustrate an embodiment where the resistor material 516 is patterned (and extends to dashed lines 517) prior to application of the metallization layer so as to be situated only in the area of the fabricated resistor.

Figure 7:
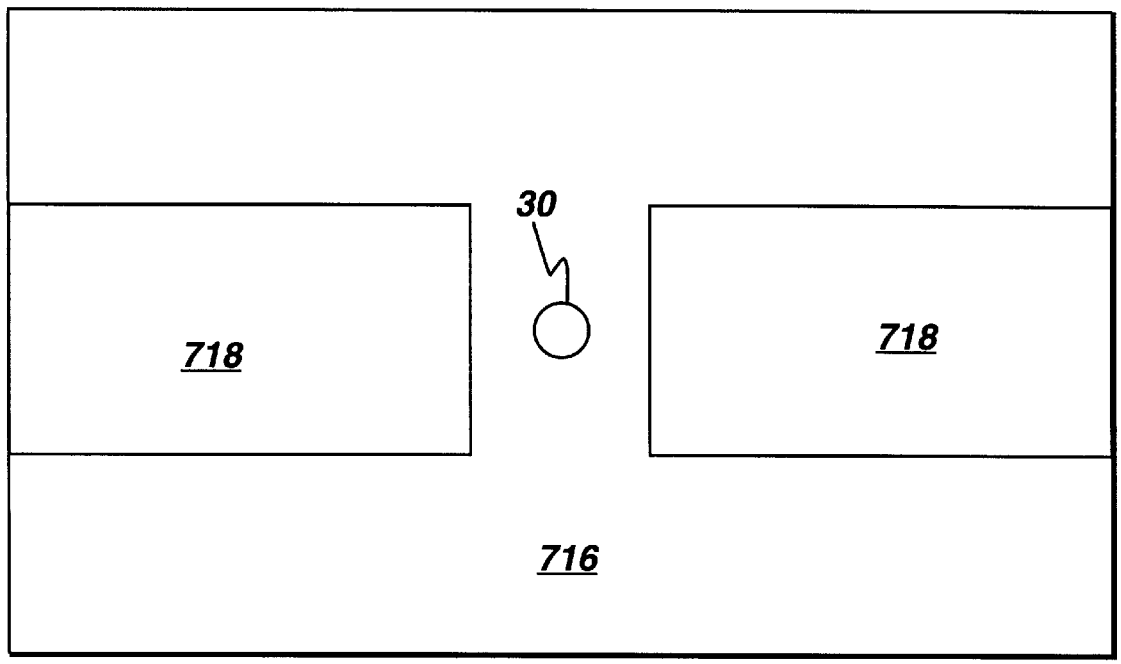
FIG. 7 is a view similar to that of FIG. 3, further showing a probe position on the resistor material.

In still another embodiment, FIG. 7 is a view similar to that of FIG. 4 showing a probe position 30 on the resistor material 716. In this embodiment, instead of measuring the resistance value with offset pads as discussed with respect to FIG. 5, either a portion or the entire layer of resistor material can characterized by determining resistance at either one or more probe position characterization points 30, respectively. Preferably a four point probe such as one manufactured by Cerprobe Corp., of Westboro, Mass., is used at each characterization point. A computer algorithm can be used to predict the resistance properties in the area between the metallization layer portions.

Figure 7A:
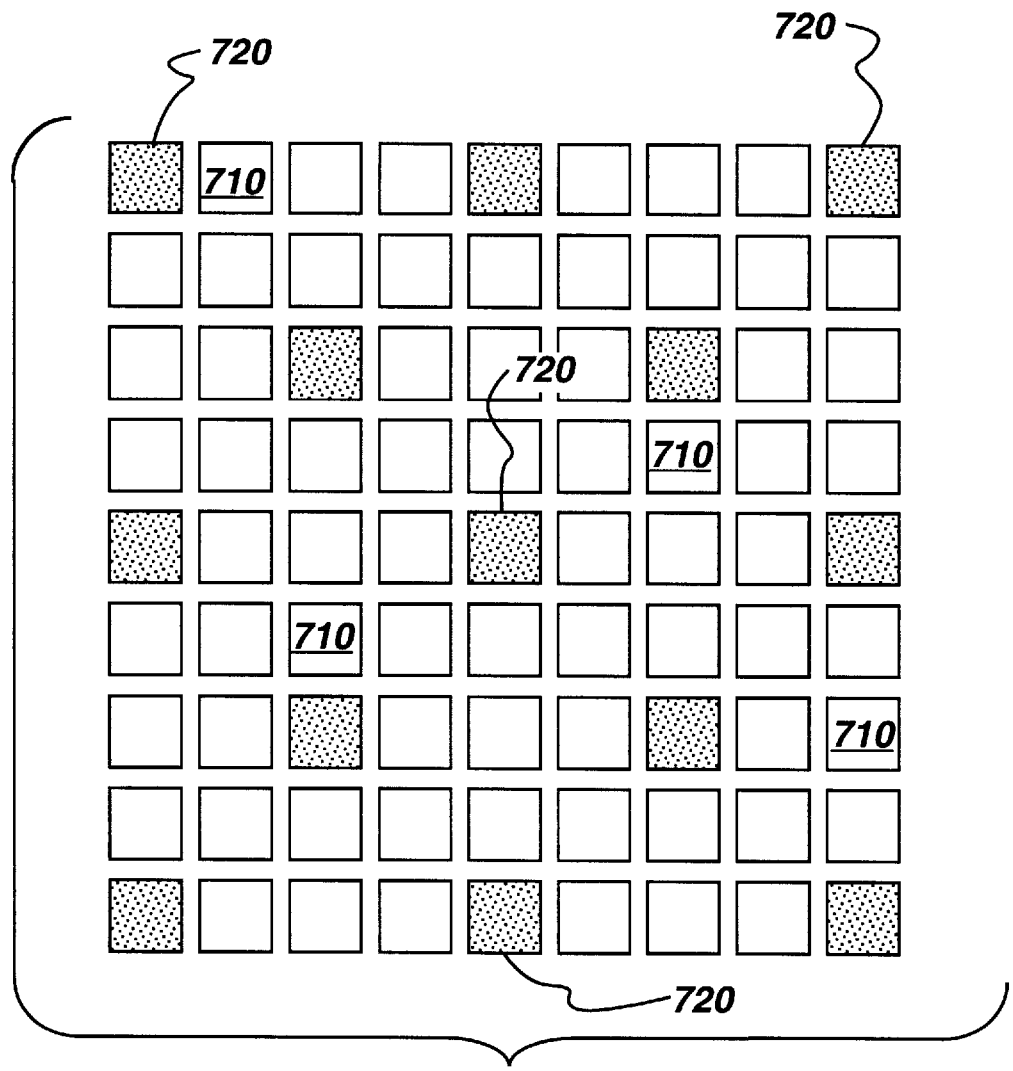
FIG. 7a is a view of a plurality of resistor locations and selected test points for estimating the resistance at each of the locations.

FIG. 7a is a block representation of an array of resistor locations 710, some of which are selected test locations 720. Resistances are determined at each of the selected test locations and used for estimating the resistances at each of the untested locations. At test locations 720 the resistances can be found by probing the metallization layer, as discussed with respect to FIGS. 4–6, or by probing the resistance material, as discussed with respect to FIG. 7.

After resistance values are determined at test locations 720, a computer algorithm can be used for response surface methodology (RSM), acceptable quality level (AQL) sampling, or lot tolerance percent defective (LPTD) sampling of the deposition of the resistor or other material. Response surface methodology, the preferred technique, is described, for example, in Juran et al., *Quality Control Handbook,* section 28 (McGraw-Hill, 1974). The general method is to selectively probe the surface at a few positions, and apply statistical analysis techniques, such as correlation and regression analysis, to the sampled data to generate a map of the surface. For resistor material an adaptive lithographic data file can be generated and applied to the final trim process of the resistor's metallization layer.

Computer software is commercially available to apply statistical analysis to selected data points and generate a map of estimated resistance. For example, BBN Software Products of Cambridge, Mass., has software designated by order number RS/1 capable of performing multiple linear regression analysis and quadratic least squares regression analysis. Using statistical analysis, there will be a minimum number of data points needed for an acceptable analyses of the array. For a nine-by-nine array, quadratic least squares regression analysis was found to be more accurate than multiple linear regression analysis, and thirteen points situated in a checkerboard pattern was found useful because it results in resistors with tolerances within five percent. It is not necessary that a precise checkerboard pattern be used, however; the data points could alternatively be selected at random. What is important is that a sufficient number of data points be spread throughout the array to generate a reasonable approximation of the resistance values in untested resistor locations.

After the measurement of resistances is made, the measured resistance of each resistor is compared to a respective desired resistance and the metallization layer can be precisely trimmed to simultaneously bring each measured resistance closer to its respective desired resistance.

A resistor of a nominal length L and width W constructed from a material with sheet resistance ρs will have a measured resistance $R_m$ given by $R_m = \rho s (L/W)$, which can be written as $$L = (R_m W)/\rho s.$$

A second resistor with resistance r and identical width W and sheet resistance ρs will have a length I given by $$I = (rW)/\rho s.$$

When adding the two resistors in series, the total length L+I is expressed as $$I + L = (R_m W)/\rho s + (rW)/\rho s$$

or, more simply length I can be written as $$I = (R_m + r) W/\rho s - L.$$

In order to adapt a resistor so that the final target resistance $R_t$ is $R_m + r$, the resistor must be extended by length I. Even though the resistor material layer has variable sheet resistance, for any given individual resistor location (a small portion of the layer), W and ρs are substantially constant and $R_m$ is directly proportional to L, and furthermore, $R_m + r$ is directly proportional to L+I. This simplifies the calculation of the adaption length by eliminating the need to know W and ps, and reducing it to a proportional percentage increase calculation. Therefore, to increase the resistance by a predetermined percent, the length can be increased by that predetermined percent. Thus, if $R_t$ is the target resistance, then $$I = L((R_t - R_m)/R_m).$$

This calculation can be used to approximate the appropriate increase in length of the resistor which can be achieved by etching back one or both portions of metallization layer 18 to create a distance of L+I between them.

When a plurality of resistors are being fabricated, it is useful to have a computer program for keeping track of length changes for each of the resistors and indicate the precise dimensions for trimming each individual resistor. A photolithographic step can then be done to expose segments of the metallization layer for simultaneous trimming of all the resistors. This exposure can be a scission action on the same positive resist that was initially used. A chemical etching procedure can be used to pattern the resistors, as discussed above. After the etching of the adaptive trim material, the photoresist is removed and the resistors are ready for use.

The trimming can be done with an adaptive lithographic file for a laser based system, or it may be used in making a lithographic mask for use on a mask based exposure system, such as those which are normally used in VLSI technologies and the like. This is easily done photolithographically, or may employ laser ablation of materials.

Resistors fabricated with this technique with a thirteen point characterization using a quadratic least squares regression analysis are about 95%–99% precise. If more data points are measured, the precision can be increased. This technique is especially helpful when D/A ladder matched ratio resistor networks or other matched networks are desired. This invention can be used in generating precision networks for semiconductor die, such as microwave GaAs die.

Figure 7B:
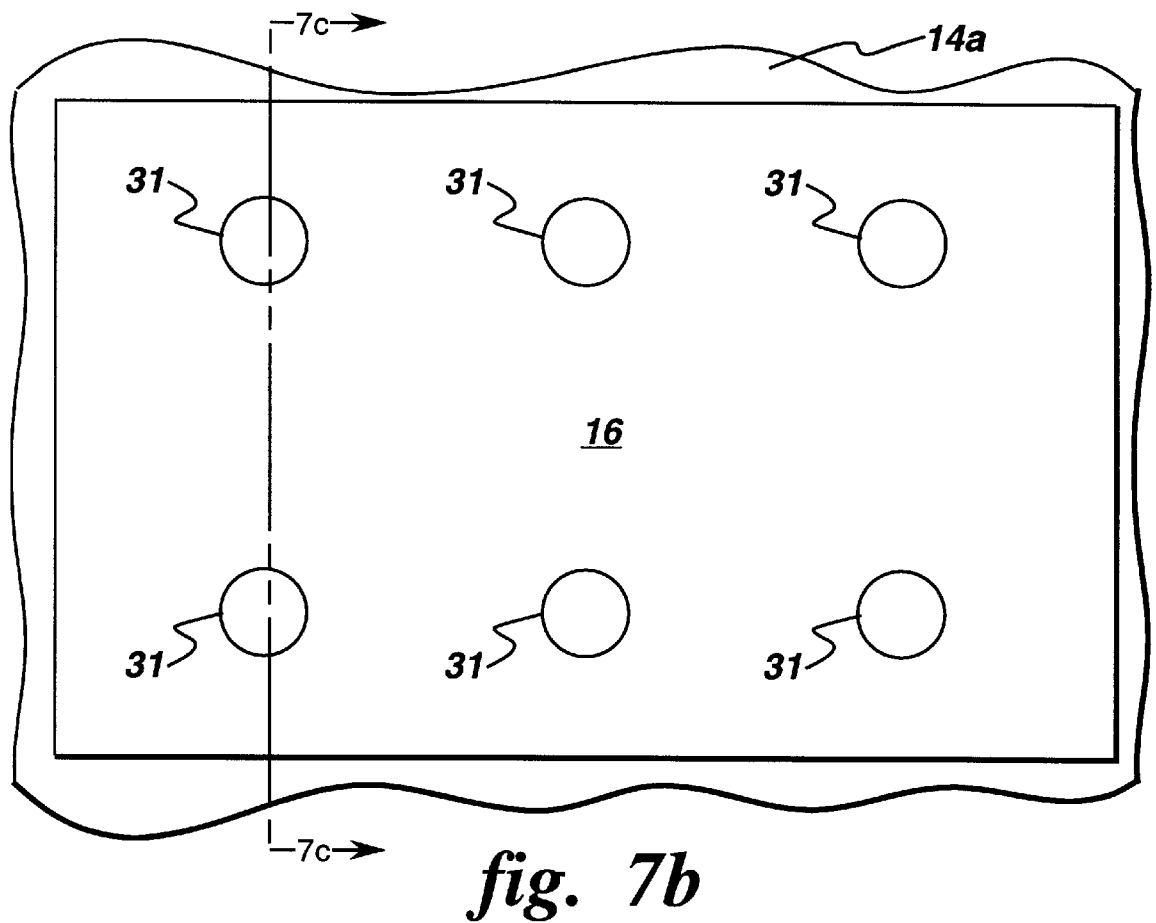
FIG. 7b is a top view of resistor material with probe positions.

FIG. 7b is a view of resistor material 16 over a base layer 14a. Base layer 14a may comprise either an organic material such as a polymer or an inorganic material such as a ceramic, for example. FIG. 7b illustrates positions of probe points 31 which are applied on the resistor material prior to the application of a metallization layer. As discussed with respect to FIG. 7, characterization of the resistor material can be done by a four point probe or similar equipment positioned at each of the characterization points 31. In the embodiment of FIG. 7b, however, this characterization is performed immediately after the deposition of the resistor material.

Information about the resistance properties of the resistor material layer can be mapped by creating a laser data file indicating the required lengths of separation between respective portions of the metallization layer (which is subsequently applied) to provide the predetermined resistance values. Then, after the metallization layer is applied, the metallization layer can be patterned precisely in accordance with the length estimations.

Figure 7C:
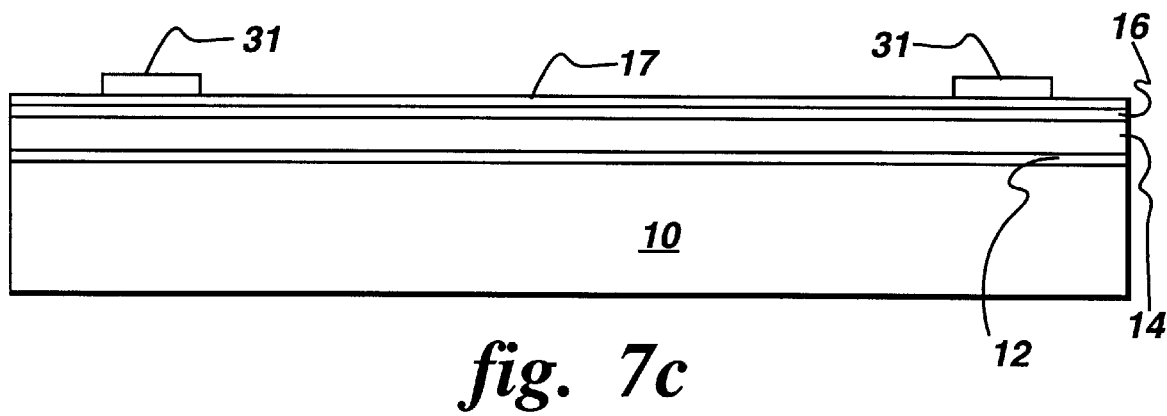
FIG. 7c is a sectional side view of the resistor material and probe positions of FIG. 7b.

Because only one metal etch sequence is needed, this is a potentially faster process than that described with respect to FIG. 7. A risk exists, however, of oxidation of the resistor material which can reduce the reliability of resistor terminations. To address this risk, as shown in the sectional side view of FIG. 7c, a thin layer 17 of a material such as titanium can be applied over the resistor material surface prior to removing the substrate from the vacuum chamber to prevent the resistor material from becoming oxidized. If a thin enough layer is used, about 800 Å to 1000 Å for example, it does not change the resistor values. The thin layer can be removed by backsputtering, for example, after being positioned in a vacuum chamber and thus provide a clean surface of the resistor material for the application of the metallization layer.

Figure 8:
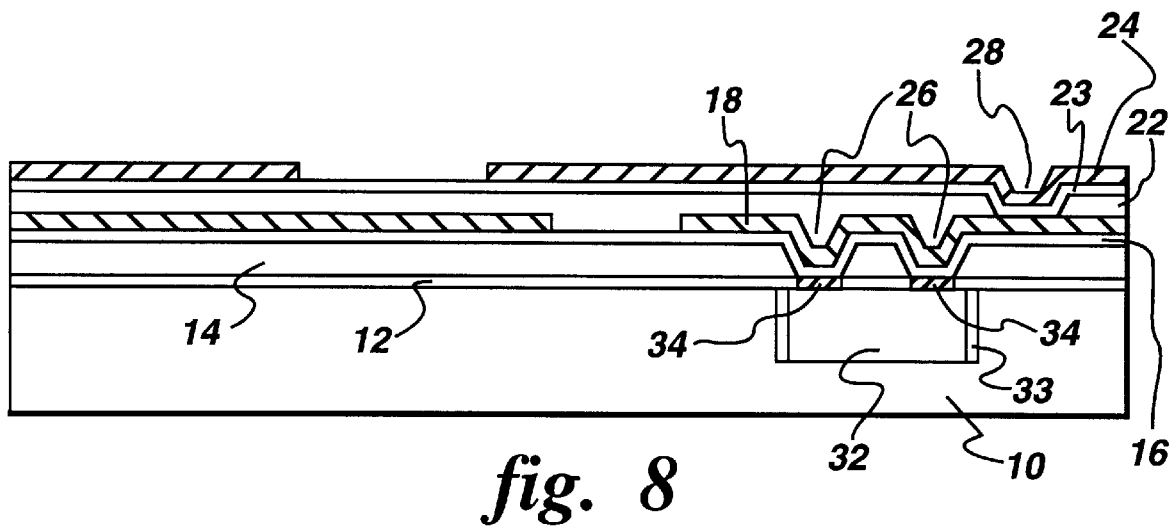
FIG. 8 is a sectional side view showing multi-layer connections of resistors of the present invention to a circuit chip.

FIG. 8 is a view showing multi-layer connections of resistors of the present invention to a circuit chip 32 through vias 26 to chip pads 34. Dielectric layer 14 is applied over a substrate 10 having a chip well 33 with a circuit chip 32 having chip pads 34 situated in the chip well. The circuit chip can be an integrated circuit chip or a discrete circuit component, for example. The chip wells can be either drilled into an alumina substrate or formed during plastic substrate molding or during circuit chip encapsulation in a plastic substrate as described in Fillion et al., U.S. Pat. No. 5,353, 498, issued Oct. 11, 1994.

Preferably the dielectric layer is applied to the substrate before the resistor material is applied. Vias 26 can be formed through the dielectric layer to the chip pads by laser drilling, for example. Next the resistor material is applied, followed by the application and patterning of the metallization layer to form a resistor. The metallization layer is patterned so that selected portions of the metallization layer extend in selected ones of vias 26 to couple the resistor to at least one chip pad. The metallization layer can be applied as discussed with respect to FIG. 1.

As shown in FIG. 8, resistors can be fabricated on each level of the MCM technology. The same process steps previously discussed for a single layer can also be used for each upper level dielectric layer. In FIG. 8, a second level resistor material layer 23 overlies a second dielectric layer 22. A second level patterned metallization layer 24 overlies second level resistor material layer 23 and can be coupled to the metallization layer 18 through a via 28 through second level resistor material layer 23 and second level dielectric layer 22.

Figure 9:
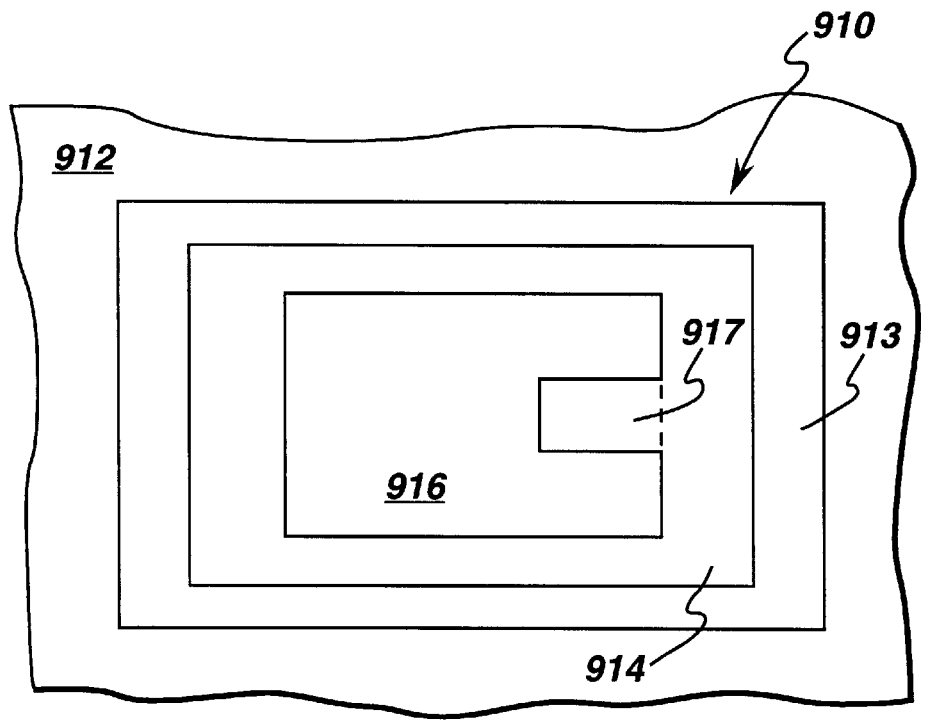
FIG. 9 is a top view of a capacitor after trimming.

FIG. 9 is a top view of a capacitor 910 after trimming. The capacitor in FIG. 9 comprises a first metal plate area 913 deposited on a base layer 912. An insulative layer 914 is applied over metal plate 913, followed by the application of a second metal plate 916. The base layer may comprise either an organic material such as a polymer or an inorganic material such as a ceramic. The insulative layer may comprise an insulative material having a high dielectric constant such as diamond-like carbon, magnesium fluoride, or silicon dioxide, for example, and the metal plates may comprise similar materials as metallization layer 18 of FIG. 1, for example. The area of second metal plate 916 is purposely designed to yield a higher than desired capacitance value.

Figure 12:
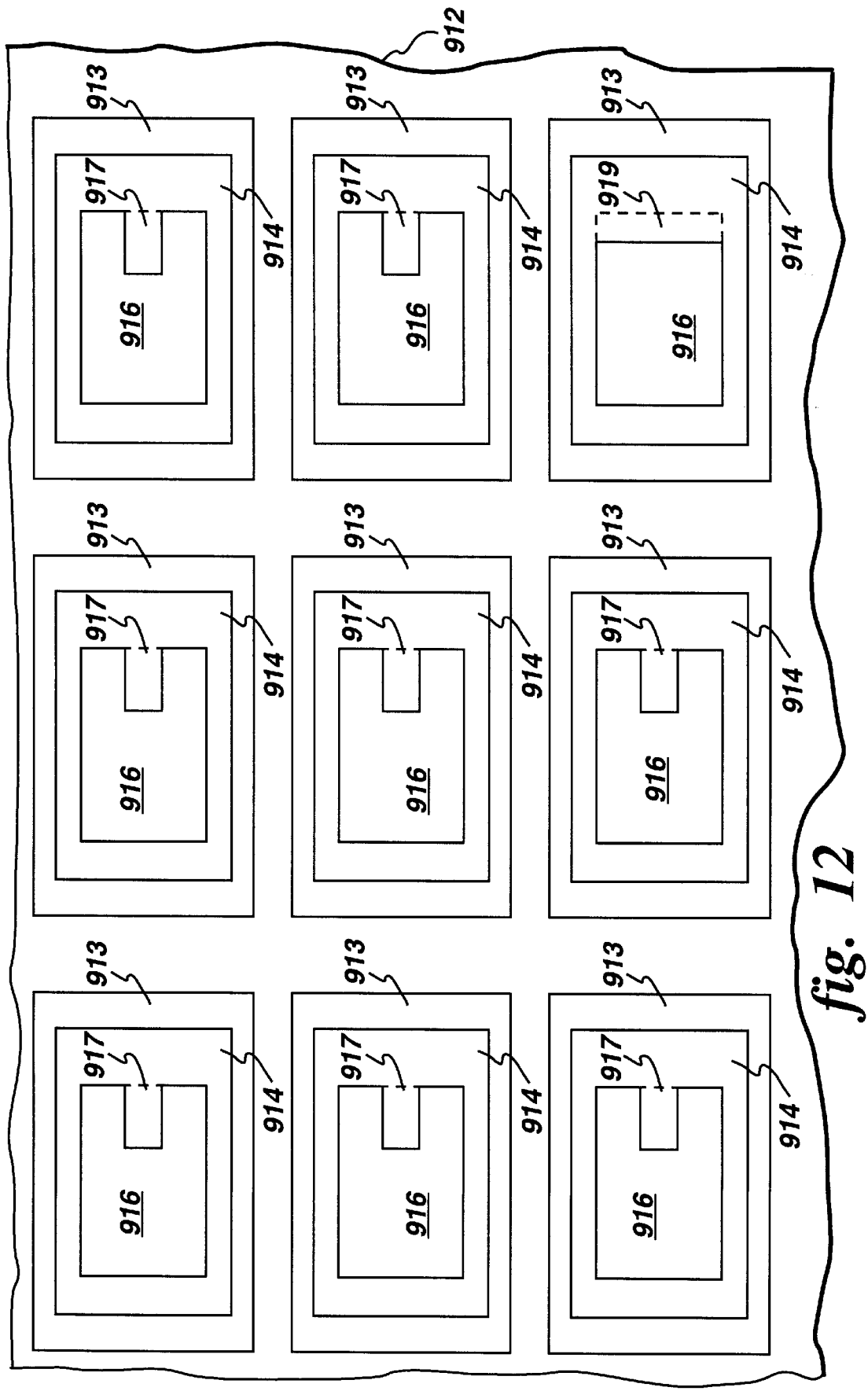
FIG. 12 is a top view of a capacitor array after trimming.

In a similar manner as discussed with respect to the resistor, the capacitance value can be measured with a probe, for example, and compared with a design parameter. An equation similar to that discussed with respect to the resistor can be used to approximate the area $A_r$ of second metal plate 916 which need be removed to achieve the desired capacitance, $$A_r = A_m((C_t - C_m)/Cm),$$

wherein $A_m$ is the original area of second metal plate 916, $C_t$ is the target capacitance and Cm is the measured capacitance. This can be measured for an array of capacitors (shown in FIG. 12) and the second metal plates can be trimmed simultaneously to produce the precise value required for each capacitor. In FIG. 9, the trimmed area is represented by area 917. The exact location of the trimmed portion is not critical. For example, the trimming could occur evenly along one side of the second metal plate, if desired, as shown by trimmed area 919 in FIG. 12.

Figure 10:
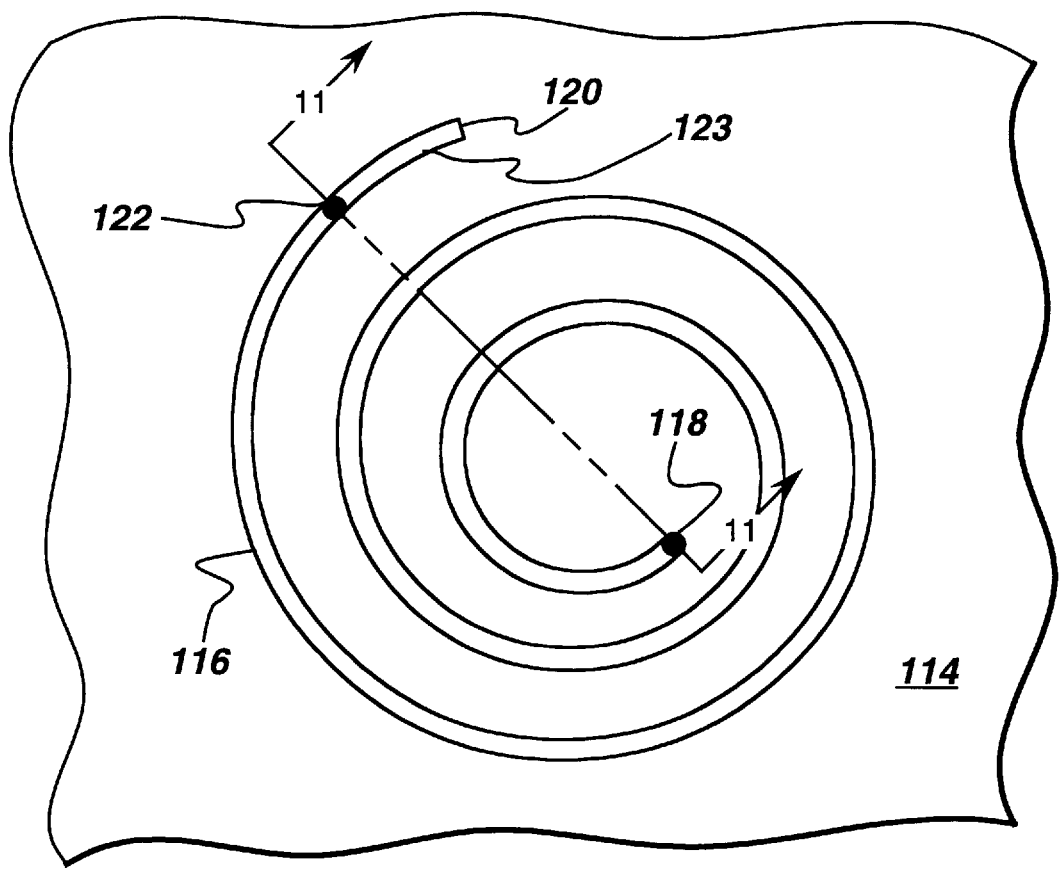
FIG. 10 is a top view of an inductor fabricated by patterning a metal coil 116 on a base layer.

FIG. 10 is a top view of an inductor fabricated by patterning a metal coil 116 on a base layer 114. The base layer may comprise either an organic material such as a polymer or an inorganic material such as a ceramic. Metal coil 116 may comprise materials similar to those of metallization layer 18 of FIG. 1, for example, and has two end points 118 and 120. The inductor coil is patterned to yield a higher than desired value of inductance.

The inductance value of the inductor can be measured with a probe. As discussed with respect to the resistor and capacitor, a calculation can be performed to determine the amount of inductor material 116 needed to provide a preferred value of inductance. This calculation is similar to the calculation of the resistance, but, depending on the proximity of adjacent portions of the coil, mutual induction may need to be factored in the equation. In an alternative embodiment, a probe can move along the coil until the appropriate locations (shown in FIG. 10 as locations 118 and 122) for obtaining a predetermined inductance value are determined. Thus, the optimal placement for a final connection via, or other electrical connection, to produce the exact value of inductance necessary for a given network can be found.

Figure 11:
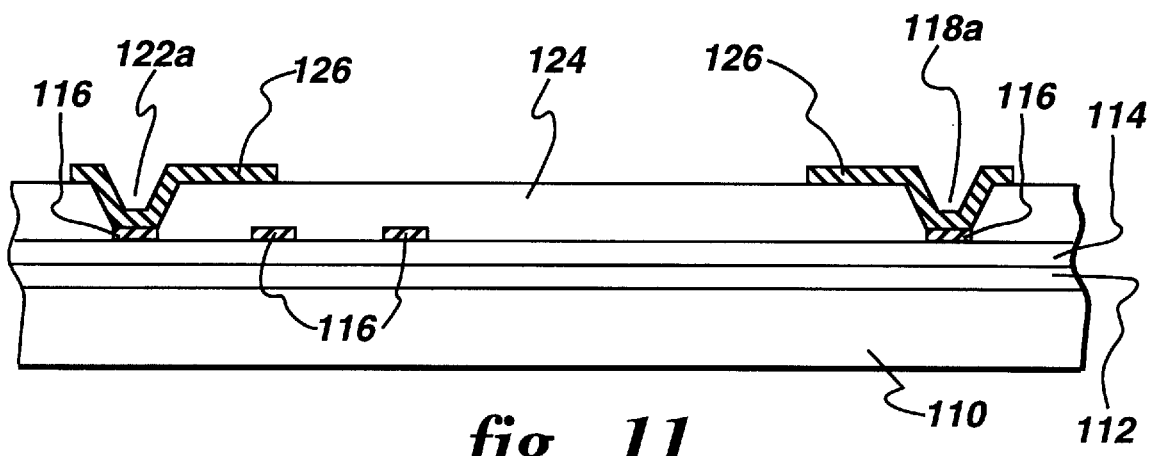
FIG. 11 is a sectional side view of the inductor of FIG. 10 further showing a second dielectric layer and a pattern of electrical conductors.

FIG. 11 is a sectional side view of the inductor of FIG. 10 further showing a dielectric layer 124 and a pattern of electrical conductors 126. After the optimal placement for electrical connection is determined, dielectric layer 124 can be applied and vias 118a and 122a can be fabricated to expose the respective locations 118 and 122 which are shown in FIG. 10. The pattern of electrical conductors 126 can then be applied to couple the inductor through vias 118a and 126a to other electronic devices in a module.

If desired, the portion 123, as shown in FIG. 10, of inductor 116 which is not needed can be removed or otherwise isolated before the application of dielectric layer 124, by using a conventional photoresist and etch process, for example.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a capacitor, comprising the steps of:

depositing a first metal plate over a base layer;

applying an insulative layer over at least a portion of the first metal plate;

depositing a second metal plate over at least a portion of the insulative layer;

measuring the capacitance between the first and second metal plates;

estimating the surface area of the second metal plate useful for obtaining a modified capacitance value between the first and second metal plates that is closer to a targeted capacitance value than the measured capacitance value; and trimming the second metal plate to create an actual surface area equivalent to the estimated surface area.

2. The method of claim 1, wherein the base layer comprises a polymer.

3. A method for fabricating an array of capacitors, the method comprising:

depositing first metal plates over a base layer;

applying insulative layers, each insulative layer being applied over at least a portion of a respective first metal plate;

depositing second metal plates, each second metal plate being deposited over at least a portion of a respective insulative layer and the at least a portion of the respective first metal plate;

measuring a capacitance value between each second metal plate and the respective first metal plate;

estimating a respective surface area of each second metal plate useful for obtaining a respective modified capacitance value between the each second metal plate and the respective first metal plate that is closer to a respective targeted capacitance value than the measured capacitance value; and trimming each second metal plate to create a respective actual surface area equivalent to the respective estimated surface area.

4. The method of claim 3 wherein, trimming each second metal plate comprises simultaneously trimming each second metal plate.

* * * * *